United States Patent [19]
Sun et al.

[11] Patent Number: 5,920,779
[45] Date of Patent: Jul. 6, 1999

[54] DIFFERENTIAL GATE OXIDE THICKNESS BY NITROGEN IMPLANTATION FOR MIXED MODE AND EMBEDDED VLSI CIRCUITS

[75] Inventors: Shih-Wei Sun; Meng-Jin Tsai, both of Hsin-Chu, Taiwan

[73] Assignee: United Microelectronics Corp., Taiwan

[21] Appl. No.: 08/903,595

[22] Filed: Jul. 31, 1997

Related U.S. Application Data

[60] Provisional application No. 60/047,252, May 21, 1997.

[51] Int. Cl.⁶ .............................................. H01L 21/8232
[52] U.S. Cl. ........................ 438/275; 438/766; 438/201; 438/981; 148/DIG. 116
[58] Field of Search ................................. 148/DIG. 117, 148/DIG. 116; 438/199, 766, 253, 275

[56] References Cited

U.S. PATENT DOCUMENTS

| | | | |
|---|---|---|---|
| 3,944,447 | 3/1976 | Magdo et al. | 148/DIG. 117 |
| 4,113,533 | 9/1978 | Okumura et al. | 148/DIG. 117 |
| 5,308,781 | 5/1994 | Ando et al. | 148/DIG. 116 |
| 5,399,507 | 3/1995 | Sun | 438/766 |
| 5,506,163 | 4/1996 | Moriya | 438/253 |
| 5,541,876 | 7/1996 | Hsue et al. | 365/178 |
| 5,668,024 | 9/1997 | Tsai et al. | 438/199 |
| 5,672,521 | 9/1997 | Barsan et al. | 148/DIG. 116 |
| 5,702,988 | 12/1997 | Liang | 438/238 |

OTHER PUBLICATIONS

C.T. Liu, et al., "High Performance 0.2 μm CMOS With 25 Å Gate Oxide Grown on Nitrogen Implanted Si Substrates," IEDM Proceedings, 1996, pp. 499–502.

*Primary Examiner*—Peter Toby Brown
*Assistant Examiner*—Maria Guerrero
*Attorney, Agent, or Firm*—Rabin & Champagne, P.C.

[57] ABSTRACT

Different thicknesses of gate oxide can be formed on a single chip in a single oxidation process by selectively implanting nitrogen into the surface of the chip in a pattern corresponding to the desired differences in gate oxide thickness. Implanting nitrogen to a silicon substrate reduces the rate at which oxide grows on the surface. Thus, by implanting different dosages of nitrogen into the surface of the substrate, thicker or thinner oxide layers can be provided. A processing chip with embedded DRAM can then be formed where the logic circuitry has a thin gate oxide and the DRAM circuitry has a thick gate oxide by implanting the higher dosage of nitrogen into the region of the chip where the logic circuits are to be formed. Different gate oxide thicknesses are then provided by exposing both the logic circuitry and the embedded DRAM section to a single thermal oxidation process.

9 Claims, 6 Drawing Sheets

DIFFERENTIAL GATE OXIDE THICKNESS BY NITROGEN IMPLANTATION FOR MIXED MODE AND EMBEDDED VLSI CIRCUITS

This application claims priority from provisional application Ser. No. 60/047,252, filed May 21, 1997.

BACKGROUND OF THE INVENTION

1. Field of the Invention

The present invention relates to the manufacture of integrated circuit devices incorporating different thicknesses of gate oxides on the surface of a substrate.

2. Description of the Related Art

Field effect transistors (FETs) are one of the most widely used devices in integrated circuits because FET circuits can be made to perform a wide variety of functions and FET devices can be manufactured having highly reproducible and predictable properties. Another advantage of FET devices is that they can be made very small and can be packed closely together. A typical FET consists of source and drain electrodes spaced apart in a substrate on either side of a channel region and a conductive gate electrode separated from the channel region by a gate oxide layer. The FET is formed on a surface of a silicon or other semiconductor substrate having a background doping of a first conductivity type. A layer of gate oxide is provided on the surface of the substrate, generally by thermal oxidation so as to provide a uniform and dense oxide layer having a predictable thickness and a predictable and low level of fixed charge. The gate electrode is next formed by depositing and patterning a layer of polysilicon, which may be rendered conductive by doping in situ during deposition or by diffusion or ion implantation after deposition. Frequently, a layer of a conductive material such as metal or metal silicide is provided on the layer of polysilicon to reduce the resistivity of the gate electrode. The source and drain electrodes are formed in the substrate by ion implantation of impurities of the second conductivity type with the gate electrode serving as a mask so that the source, drain and channel regions are self-aligned to the gate electrode.

FET operating characteristics are determined by many different aspects of the FET structure including the thickness of the gate oxide layer. The upper limit on the operating voltage of the FET largely derives from the voltage at which the gate oxide layer undergoes dielectric breakdown, which in turn is largely determined by the thickness of the gate oxide layer. Because FETs used in different applications are designed to operate at different operating voltages, FETs in practical applications incorporate different thicknesses of gate oxide layers to accommodate the different operating voltages. FET's may also have different thicknesses of gate oxide to facilitate either high speed operation (thinner gate oxide) or low leakage (thicker gate oxide). Thus, FETs within memory devices might be formed having one thickness of gate oxide, while FETs in high speed, low voltage logic circuits might have a second, significantly thinner gate oxide layer. Most often, memory and logic circuits are segregated on separate chips. When memory and logic circuits are formed on separate chips, the desired gate oxide thicknesses are achieved by using different global thermal oxidation procedures during manufacture to grow the different thicknesses of gate oxides. Different thicknesses of gate oxide are readily provided by exposing the different substrates to oxidizing environments for different amounts of time.

Recently, an increasing number of chip designs have been proposed which would incorporate circuits on a single chip that use FETs having different thicknesses of gate oxides, whether to obtain different operating voltages or to vary other operating characteristics. For example, chip designs have been proposed which include logic circuits using FETs having thinner gate oxide layers and which include memory circuits using FETs having thicker gate oxide layers. To implement these designs successfully, it is necessary to form FETs having different gate oxide thicknesses on the same chip. This might be accomplished by masking portions of the chip and performing different thermal oxidation processes for each of the different portions of the chip. It will be appreciated that implementation of the multiple masking steps and multiple thermal oxidation steps is typically quite complicated. To maintain the integrity of a gate oxide layer, it is necessary to cover the gate oxide layer with the polysilicon layer that will be formed into the gate electrodes of the FETs in that region before any other processing steps are performed. Thus, if a chip design requires FETs having multiple distinct gate oxide thicknesses, it would be necessary to mask the chip in a manner which exposes only those portions of the chip where FETs incorporating a first thickness of gate oxide are to be formed. The exposed portions of the chip are then thermally oxidized and polysilicon is deposited over the chip. The polysilicon layer must then be removed over those other portions of the chip where other thicknesses of gate oxide are to be grown. This process is repeated for each of the different thicknesses of gate oxide to be formed on the chip.

This strategy of multiple masking steps and multiple thermal oxidation steps has disadvantages, however. Obviously, the process flow used in forming FETs with different thicknesses of gate oxide is much more complicated, time consuming and demanding of manufacturing resources than more conventional, uniform gate oxide FET manufacturing processes. Such processes expose portions of the substrate and the gate electrode polysilicon to multiple etching steps and multiple photoresist masks, which can introduce defects to later processing steps. This strategy requires multiple thermal oxidation steps which in turn requires that some of the gate oxide layers undergo multiple high temperature processing steps, which can reduce the reliability of the gate oxide layers and thereby reduce the reliability of the FETs incorporating the gate oxide layers.

It would accordingly be desirable to provide an improved method of forming different thicknesses of gate oxide layers on a single chip.

SUMMARY OF THE PREFERRED EMBODIMENTS

In accordance with a preferred embodiment of the present invention, an integrated circuit is formed on a substrate that has a first region on which first MOS devices are to be formed and a second region on which second MOS devices are to be formed. A first concentration of a first dopant is provided in the semiconductor substrate at the surface of the second region. A second concentration of a second dopant is provided in the semiconductor substrate at the surface of the second region. The surface of the semiconductor or substrate is oxidized to grow a first thickness of oxide on the first regions of the semiconductor substrate and to grow a second, different thickness of oxide on the second region in a single oxidizing process. First MOS devices are formed on the first regions of the semiconductor substrate incorporating the first thickness of oxide and second MOS devices are formed on the second region of the semiconductor substrate incorporating the second thickness of oxide.

In accordance with another preferred embodiment of the invention, an integrated circuit is formed on a substrate having a first region on which first MOS devices having a first gate oxide thickness are formed and a second region on which second MOS devices are formed. The composition of the substrate is adjusted within at least one of the first region and the second region so that the first region and the second region will have different oxide growth characteristics in an oxidation environment. The substrate is subjected to an oxidation environment so that a first thickness of a first oxide layer grows in the first region and a second thickness of a second oxide layer grows in the second region upon exposure of the first region and the second region to an oxidation environment. First MOS devices are formed on the first region of the substrate and second MOS devices are formed on the second region of the substrate.

DETAILED DESCRIPTION OF THE PREFERRED EMBODIMENTS

Particularly preferred embodiments of the present invention facilitate the formation of high speed processing circuits, embedded circuits, mixed mode circuits and other circuits that incorporate FETs with different thicknesses of gate oxide on a single chip. The oxidation characteristics of selected portions of a silicon substrate are altered so that different thicknesses of oxide will grow on the different portions of the substrate when the different portions of the substrate are simultaneously exposed to an oxidizing environment for a fixed time period. Processing in this manner allows MOS circuits incorporating different thicknesses of gate oxide layers to be formed in the different portions of the substrate, as desired for the particular complex circuit being formed, while exposing the substrate to only one high temperature oxidation step. Minimizing the total number of times that each of the gate oxide layers is exposed to high temperatures during the manufacturing process improves the quality of the gate oxide layers in the completed device. In addition, the process for forming such a complicated circuit is simplified and shortened by performing only a single thermal oxide process for forming gate oxide layers.

Figure 1:
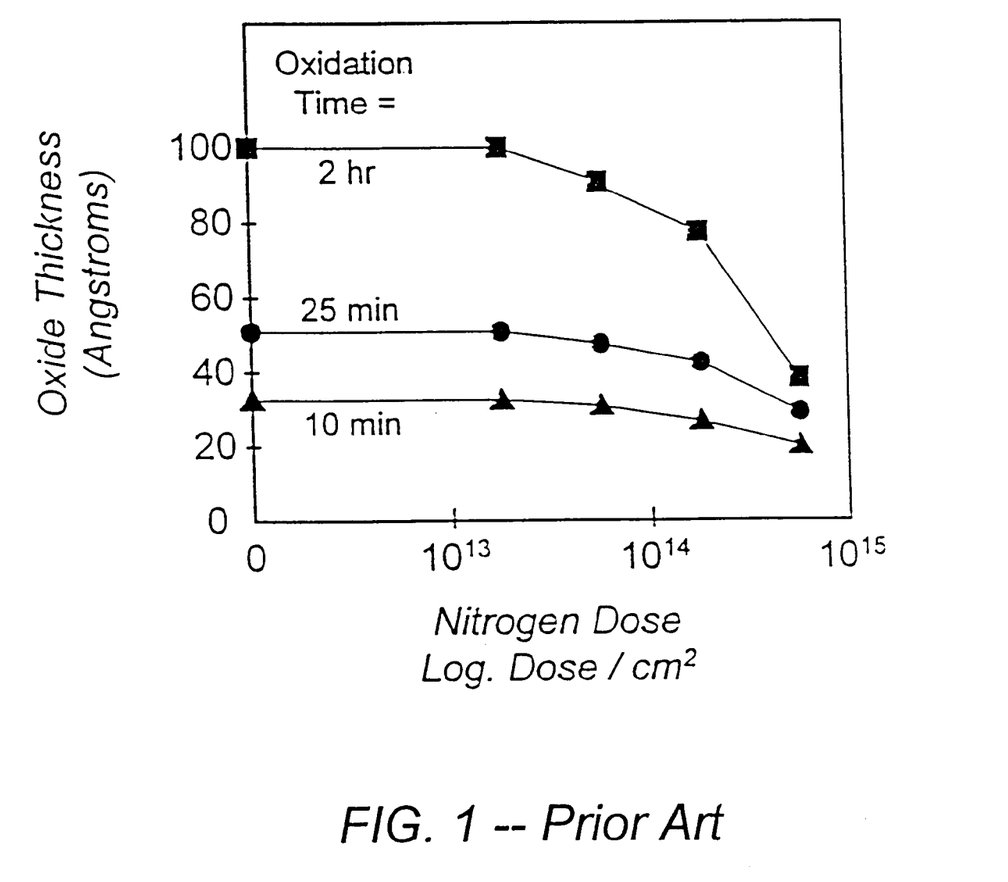
FIG. 1 illustrates the rate of oxide growth on different nitrogen-implanted silicon surfaces.

The oxidation characteristics of a silicon substrate can be altered, for example, by altering the chemical composition at the surface of the silicon substrate. Incorporating even a small amount of nitrogen into silicon reduces the rate at which thermal oxidation proceeds on the modified silicon surface. This phenomena is illustrated schematically in FIG. 1. Different dosages of nitrogen are implanted into the surface of the silicon substrate and the silicon substrate with its different dosages of implanted nitrogen is subjected to an oxidizing environment for various time periods. As can be seen in FIG. 1, an oxide layer grows to a thickness of about 100 Å on an undoped silicon surface exposed to an oxidizing environment for two hours. By contrast, if a dosage of $5 \times 10^{14}/cm^2$ of nitrogen ions are implanted at an energy of about 25 KeV to a silicon substrate, a two hour exposure to the oxidizing environment grows an oxide layer having a thickness of only about 40 Å. It is to be expected that even more dramatic variations in the rate of oxide growth might be achieved for longer oxidation time periods. Those of ordinary skill in the art will readily appreciate that a range of different oxide thicknesses can be selected by independently varying the amount of nitrogen present on the surface of the silicon substrate undergoing oxidation.

Further discussion of this phenomena can be found in the paper by Liu, et al., "High Performance 0.2 µm CMOS with 25 Å Gate Oxide Grown on Nitrogen Implanted Si Substrates," *Proceedings of the IEDM* 1996 499–502 (1996), which paper is hereby incorporated by reference. As discussed in that paper, it appears that nitrogen implanted into a silicon substrate subsequently exposed to an oxidizing environment diffuses into the oxide layer during oxidation, with little of the nitrogen remaining in the substrate after even a brief oxidizing process so that most of the nitrogen accumulates near the interface between the grown oxide layer and the silicon substrate. It is to be expected that other implanted dopants or other alterations in the chemical composition of the substrate might also produce variations in the rate of oxide growth in thermal oxidation processes, in a manner similar to that illustrated in FIG. 1 for nitrogen implantation. Nitrogen implantation is presently preferred because nitrogen implantation has little effect on the electrical characteristics of the silicon substrate at the doping level presently contemplated when practicing the present invention. If, as suggested by the Liu article, nitrogen segregates into the oxide layer during oxidation, then nitrogen is further preferred since the oxide layer incorporating nitrogen will be expected to provide a higher level of coupling between a gate electrode and a substrate in a MOS FET. In addition, as illustrated in FIG. 1, the thickness of gate oxide grown in a fixed time exposure to the oxidation process can be varied over a wide range, generally encompassing the thicknesses desirable for gate oxides to be used in various of the circuits that might be combined together on a single chip. Other conditions for the energy and dosage to be used for the nitrogen implantation in accordance with the present invention can also be determined through simple variation of the parameters illustrated in FIG. 1, or through the methods discussed in the Liu paper above.

A suitable alteration of the oxidation characteristics of a silicon substrate can thus be accomplished by implanting nitrogen into the surface of a portion of a silicon wafer in a sufficient quantity to alter the oxidation rate by a desired amount. A series of masking and implantation steps can then be used to form localized regions on the surface of the silicon substrate having different oxidation characteristics. The substrate is then oxidized to grow different thicknesses of thermal oxide corresponding to the localized variations in the oxidation characteristics of the substrate. Processing continues to form MOS circuits on the selected regions that have operating characteristics associated with the particular purposes of the MOS circuits.

Various specialized circuits require the close cooperation of different circuit components that have fundamentally different operating characteristics. For example, the core function of graphics processors and graphics accelerators are performed by circuits like microprocessors or digital signal processors which are typically implemented in high speed MOS logic circuits using high speed FETs with low operating voltages and thin gate oxide layers. Typically, graphics processors require significant peripheral circuitry that, while not being specific to the function of the graphics processor, are nevertheless essential to its use. For example, graphics processors, high speed microcontrollers and microprocessors might use high speed and low operating voltage logic circuits internally but generally must use more robust and higher operating voltage I/O circuits to interface with other circuits on other chips. Thus, it is desirable to provide on a given logic circuit at least a section of the substrate devoted to MOS FETs that include thicker gate oxide layers and that are suitable for higher operating voltages to facilitate I/O functions. Providing a distinct set of MOS FETs for the I/O circuitry is greatly preferred over the alternative of making all of the logic circuitry according to the design characteristics required for I/O circuitry. Such a universal design would impair the performance of the logic circuitry in an undesirable manner. Conventional strategies of multiple masking steps and multiple thermal oxidation steps to achieve the different operating characteristics of the logic and I/O circuit sections may, however, undesirably impair performance of one or both circuit sections. Problems arise because of the repeated high temperature processing steps and because the elevation of masking layers over portions of the chip place limits on the types of photolithography that can effectively be used in the manufacture of such devices.

Further difficulties arise when forming sections of embedded memory on such high performance chips. For optimum performance of some designs of graphic processors, it is very desirable to provide a quantity of embedded memory on the chip so that the memory can be accessed without having to pass through I/O circuitry or a memory or system bus external to the processor, particularly if there is competition for the memory or bus resources. Such on-chip or embedded memory has the further advantage of being accessible at the higher clock rates typically used internally in such processors. Thus, for high speed processing on large quantities of data, such as that performed in graphics processors, it is desirable to incorporate sections of embedded dynamic random access memory (DRAM) to optimize the overall system performance. Providing such embedded DRAM on the chip involves considerable difficulties, beginning with an even more pronounced difficulty in maintaining sufficient depth of field for the photolithography steps used in manufacturing the components of the DRAM. The capacitor dielectrics for such DRAM capacitors represent a further challenge to the provision of embedded DRAM in a graphics or other type of processing chip, because the capacitor dielectrics often include one or more layers of thermal oxide, which are typically formed in high temperature processing steps. It is very desirable to minimize the topography and high temperature processes associated with providing multiple thicknesses of gate oxide on a single chip. In doing so, the processing margins for subsequent processes, such as forming charge storage capacitors for embedded DRAMs, can be improved.

Figure 2A:
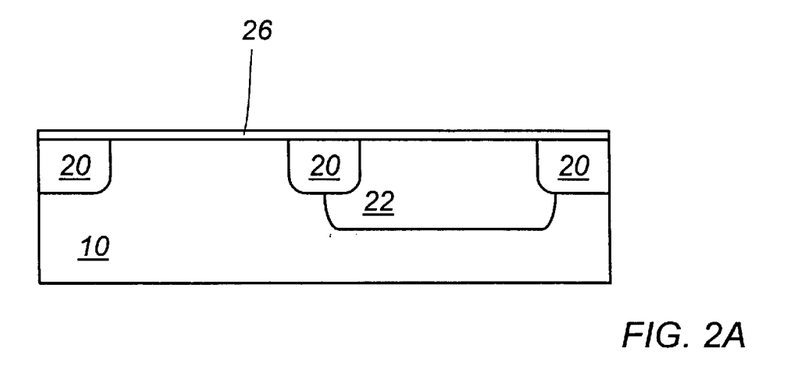
FIGS. 2A–C illustrate the isolation devices for three different sections of a circuit formed in accordance with the present invention.
Figure 2B:
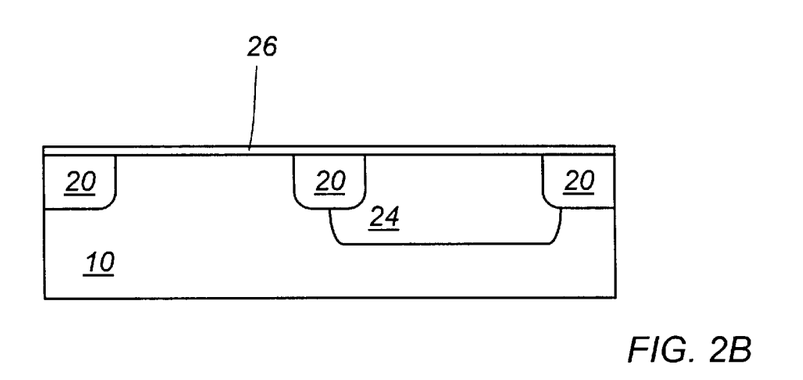
Figure 2C:
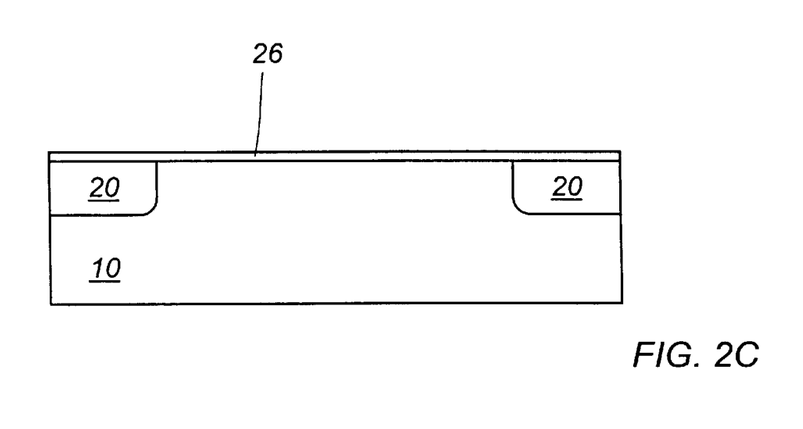

Further aspects of the present invention are now described with reference to a particular example of a processing circuit incorporating on a single chip embedded DRAM, high speed logic circuitry, and I/O circuitry capable of operating at higher voltages than the logic circuitry. FIGS. 2A, 2B and 2C illustrate different sections of a substrate on which the components of a processing circuit are to be formed. High speed logic circuitry will be formed in section A, I/O circuitry will be formed in section B and embedded DRAM will be formed in section C. In the illustrated embodiments, shallow trench isolation structures 20 and a number of conventional implantations are formed before the growth of the gate oxide layers. Thus, FIGS. 2A–C show shallow trench isolation regions 20 formed by etching trenches into substrate 10 and then refilling the trenches using chemical vapor deposition (CVD) oxide. In addition, isolation wells 22, 24 are provided for the CMOS circuitry to be formed in sections A and B in this example. After the various preparatory processing steps, a pad oxide layer 26 of approximately 200 Å in thickness is provided by thermal oxidation or by CVD. This pad oxide layer 26 protects the active device regions during the subsequent processing and implantation steps. Implantation of the preferred nitrogen oxidation rate modifier is most preferably performed shortly before the growth of the gate oxide layer on the substrate 10. Most preferably, no thermal oxidation step or other high temperature step which would normally be accompanied by the growth of an oxide layer is performed after the nitrogen implantation and before the growth of the gate oxide on the substrate. This sequence of processing steps is preferred because of the observed tendency of the nitrogen to diffuse into oxide grown on a nitrogen-implanted silicon surface. By growing the gate oxide layer as the first thermal processing step following the nitrogen implantation, the greatest effect on the oxidation rate is observed. It will further be appreciated that, presuming that the reported observations are correct, it is unnecessary to anneal the nitrogen implantation to achieve the benefits of slower oxidation. This is because the nitrogen appears to diffuse readily in the initial stages of the oxidation process and to have its primary effect as a barrier to oxygen diffusing to the surface of the silicon substrate.

Figure 3A:
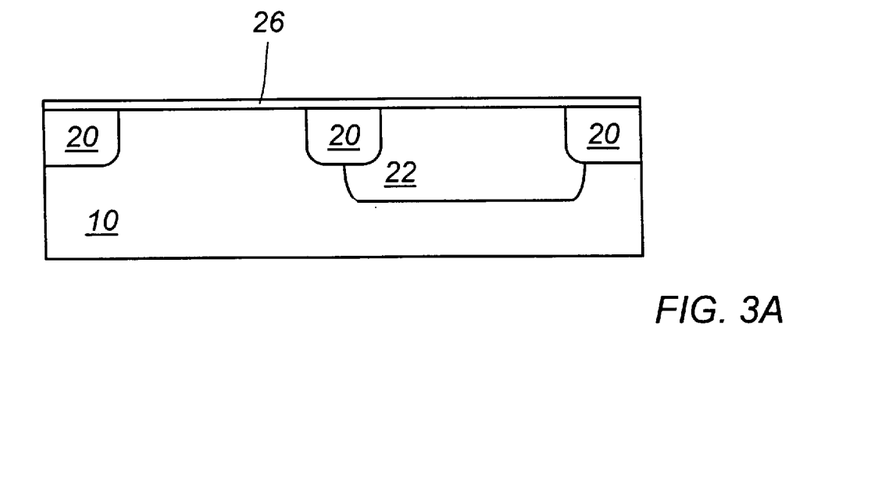
FIGS. 3A–C illustrate an initial oxidation rate modification step to the circuit illustrated in FIGS. 2A–C.
Figure 3B:
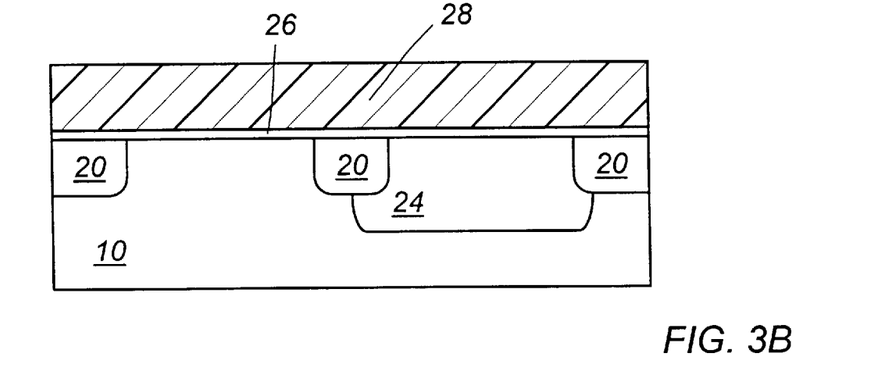
Figure 3C:
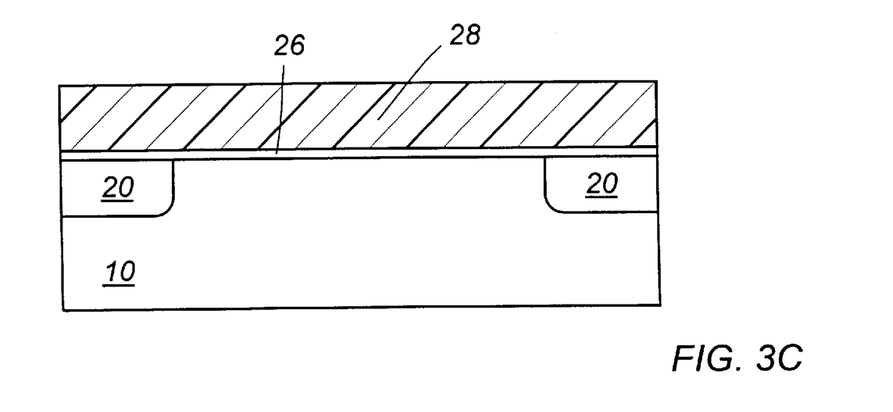

Referring now to FIGS. 3A–C, the substrate sections B and C on which the I/O circuitry and embedded DRAM circuitry are respectively to be formed are covered by a photoresist mask 28. The photoresist mask 28 is formed in a conventional manner to expose only the section A on which the high speed logic circuitry is to be formed. As illustrated, the surface of the substrate 10 in section A is covered only by pad oxide layer 26 which protects the substrate and prevents channeling of the implanted nitrogen ions. Nitrogen ions are then implanted into the surface of the substrate in section A to a dosage of about $5 \times 10^{14}/cm^2$ at an energy of about 25 KeV through the pad oxide layer 26. No nitrogen is implanted in section B and C because these sections are covered by the photoresist mask 28. When the section A nitrogen-implanted silicon surface is later exposed to an oxidizing environment for two hours, a gate oxide layer of approximately 40 Å will grow on the surface of the substrate. Such a thin gate oxide layer is suitable for use in high speed logic FETs with operating voltages of between about 1.8–2.5 V.

Figure 4A:
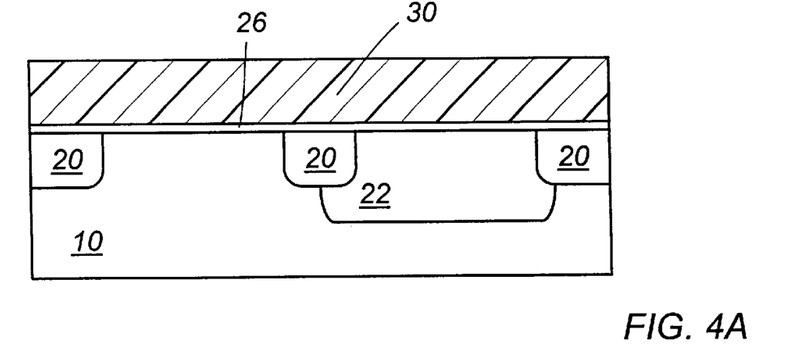
FIGS. 4A–C illustrate the further oxidation rate modification step performed on the circuit of FIGS. 3A–C.
Figure 4B:
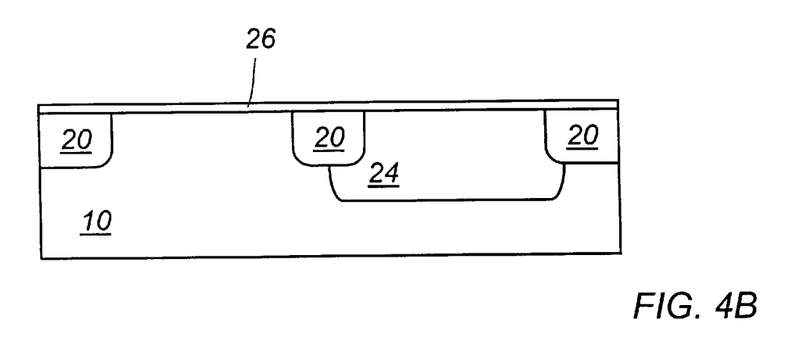
Figure 4C:
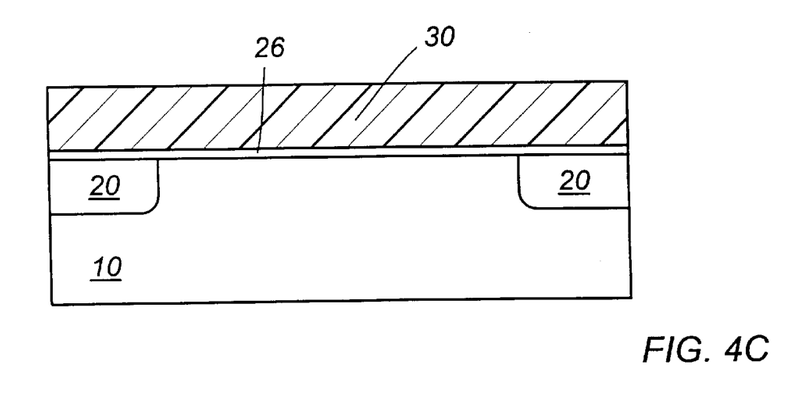

Typically, the next stage of nitrogen implantation is performed by stripping the existing photoresist mask 28 illustrated in FIGS. 3A–C and replacing the mask with a new mask covering the section A portion of the substrate intended for low voltage logic circuitry and the section C portion of the substrate intended for embedded DRAM circuitry. Preferably, the old photoresist mask 28 is stripped in a comparatively low temperature ashing process. Most preferably, the ashing process is oxygen-based and will not attack the pad oxide layer 26 covering the surface of the substrate 10 in sections A, B and C. In this way, there is no need for a thermal oxidation process to provide a pad oxide layer over section B before implantation of nitrogen ions. After the first nitrogen implantation mask is removed, a second nitrogen implantation mask 30 is provided in photoresist by conventional lithography to cover the section A portion of the substrate to be devoted to logic circuitry and the section C portion of the substrate to be devoted to embedded DRAM circuitry, as illustrated in FIGS. 4A–C. Nitrogen ions are then implanted through the exposed pad oxide layer 26 into the section B portion of the substrate 10 illustrated in FIG. 4B. Preferably, a dose of approximately $2\times10^{14}/\text{cm}^2$ of nitrogen ions is provided through the pad oxide layer at an energy of about 25 KeV. When the section B nitrogen-implanted silicon surface is later exposed to an oxidizing environment for two hours, a gate oxide layer of approximately 75 Å in thickness will grow on the surface. This thickness of gate oxide is appropriate for FETs in I/O circuitry capable of operation at about 3.3 V.

By selecting an appropriate nitrogen implantation dose for the section A portion of the substrate to be devoted to logic circuitry and for the section B surface of the substrate to be devoted to I/O circuitry, an appropriate oxidation time period can be selected so that no nitrogen implantation need be provided to the embedded DRAM section C. Exposure of the unimplanted silicon surface of section C to an oxidizing environment for two hours grows an oxide layer having a thickness of approximately 100 Å. Such a thicker oxide layer is preferred for embedded DRAMs to reduce leakage through the transfer FET of the embedded DRAM cell. Thus, in preferred embodiments of the present invention, the nitrogen implantation dosages and the oxidation time are selected so that growth of the thickest gate oxide layer can be accomplished with no nitrogen implantation, thereby saving a masking step and an implantation step. If this is impractical or if there is some reason to provide a gate oxide layer incorporating nitrogen for the DRAM or other circuitry incorporating comparatively thick gate oxide layers, then nitrogen implantations might be made into all sections of the illustrated chip. In addition, while the described embodiment provides three distinct thicknesses of gate oxides, it would of course be possible to provide additional sections of the substrate surface with different oxidation characteristics so that still further different thicknesses of gate oxide could be incorporated in different types of MOS circuitry formed on the substrate. Furthermore, if other oxidation rate modifiers are identified that are compatible with MOS circuitry, such modifiers might be selectively implanted or otherwise incorporated into the surface of the silicon substrate either in areas different from those discussed above or in conjunction with the nitrogen oxidation rate modifying implantations.

Figure 5A:
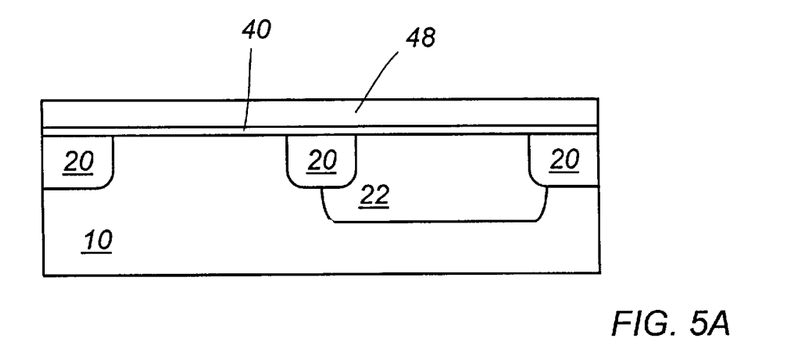
FIGS. 5A–C illustrate the results of a thermal oxidation and polysilicon deposition process in accordance the present invention applied to the above-illustrated circuit.
Figure 5B:
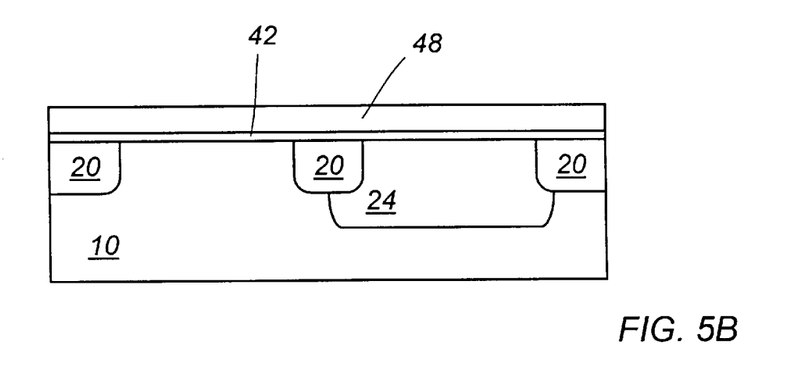
Figure 5C:
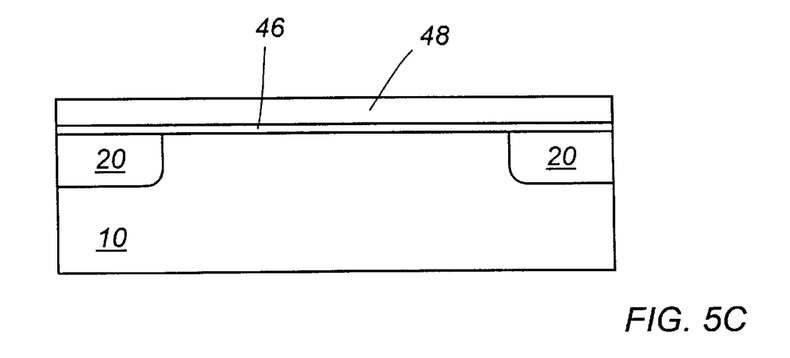

Once all of the desired oxidation rate modifying implantations are performed, the second photoresist mask 30 is stripped and the protective pad oxide layer 26 is stripped from all of the substrate surfaces on which a gate oxide layer will be grown. The mask 30 may be removed by ashing and the pad oxide might be removed by dipping the substrate in a dilute HF solution. The substrate 10 is then placed in a furnace and the different sections of the substrate are exposed to a common oxidizing environment for a single time period to grow different oxide thicknesses on the different sections of the substrate. In the illustrated embodiment, the substrate may be exposed to the oxidizing environment for two hours. This oxidation process accomplishes growth of a 40 Å thick oxide layer 40 in section A, a 75 Å thick oxide layer 42 in section B, and a 100 Å oxide layer 46 in section C. Preferably, a layer of polysilicon 48 is deposited over the different gate oxide layers 40, 42, 46 soon after formation of the gate oxide layers. To facilitate the particularized processing required by the circuitry to be formed in the different sections, it is preferred that the polysilicon not be doped at this time. The polysilicon in different sections may then be doped to the particular doping levels required for the different types of circuitry. Typically, a single thickness of polysilicon can be deposited over all of the illustrated sections to accommodate the different requirements for the polysilicon gate electrodes in the different circuits. If this is not possible, on the other hand, a thinner layer of polysilicon of approximately 1000 Å might alternately be deposited. Such a thinner layer of polysilicon would later be augmented to achieve the thickness of polysilicon gate electrode required by the different circuits. Either a comparatively thick or a comparatively thin polysilicon layer 48 can be used to protect the gate oxide layers from further processing. The structure produced, incorporating a polysilicon layer 48 of between 1500–3000 Å, is illustrated in FIGS. 5A–C.

Figure 6A:
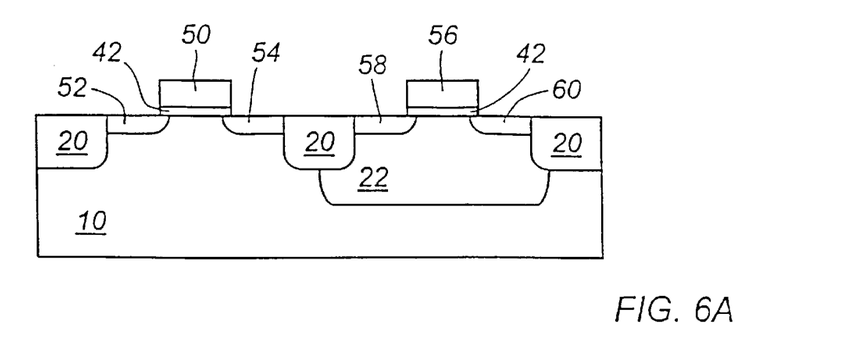
FIGS. 6A–C illustrate different parts of a circuit incorporating different thicknesses of gate oxide.
Figure 6B:
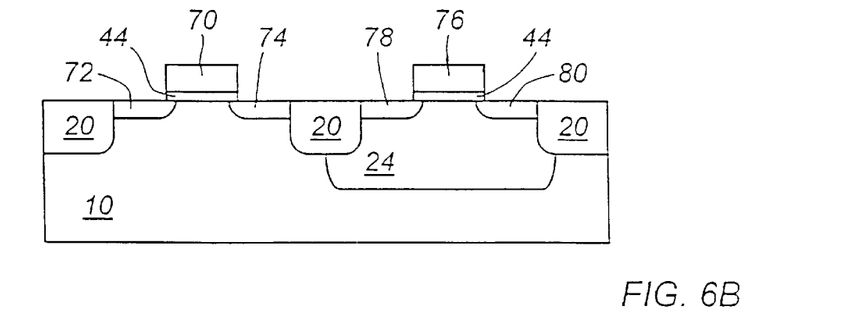
Figure 6C:
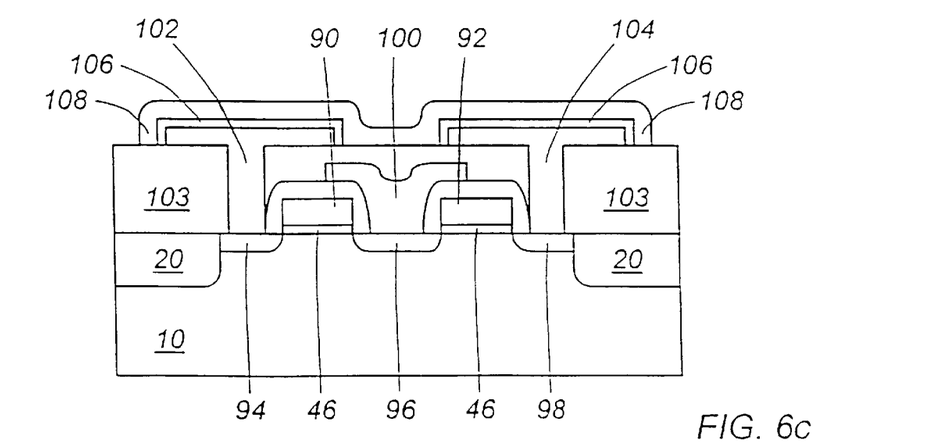

Referring now to FIGS. 6A–C, the processing circuit with embedded DRAM is shown after the individual logic, I/O and DRAM circuits have been formed on the respective sections of the substrate. Thus, a high speed logic circuit incorporating FETs formed on a 40 Å thick gate oxide layer is illustrated as being formed within section A, an I/O circuit incorporating FETs formed on a 75 Å thick gate oxide layer is illustrated in section B, and an embedded DRAM where the transfer FETs are formed on a 100 Å thick gate oxide layer is illustrated in section C. Referring first to FIG. 6A, a high speed logic circuit is shown that is compatible with operating voltages on the order of 1.8–2.5 V. For the illustrated embodiment, the substrate 10 has a P-type background doping or at least a surface layer having a P-type background doping. N-well 22 is formed at an early stage of processing to accommodate the formation of CMOS logic circuits or a combination of NMOS and PMOS circuits in close relationship. On the left hand side of the illustrated circuit is an NMOS FET incorporating a gate electrode 50 on the approximately 40 Å thick gate oxide layer formed in the selective oxidation process discussed above. Source and drain regions 52, 54 are formed on either side of gate electrode 50 in the conventional self-aligned manner. A PMOS device is formed in the N-well 22 in a similar manner and includes gate electrode 56 and source and drain regions 58, 60, as illustrated. Gate electrodes 50, 56 are preferably formed, at least in part, from polysilicon layer 48 illustrated in FIG. 5A. Patterning and doping of the gate electrodes is accomplished in the well-known, conventional manner. It is conventionally desirable to form high speed logic devices such as that illustrated in FIG. 6A using multilayered gate electrodes including a layer of metal silicide over a lower polysilicon layer. In addition, the logic circuit of FIG. 6A would typically incorporate silicided source/drain contacts to achieve lower contact resistance. The use of silicided source/drain contacts might also be practiced in the I/O circuitry illustrated in FIG. 6B but would not be utilized in the embedded DRAM structure illustrated in FIG. 6C. As such, there are some instances where the circuits of FIG. 6A and FIG. 6B could in the large measure be formed simultaneously. On the other hand, it is typically preferred to form the FIG. 6C embedded DRAM in an entirely separate process.

The circuit of FIG. 6B may be an I/O circuit compatible with 3.3 V operating voltages and might, for example, consist of one or more output buffers. The particular circuit illustrated in FIG. 6B is a cross-section through an inverter that forms a portion of the I/O circuitry. In typical configurations, a common source/drain contact might be connected to an I/O pad on the chip and the gates of the inverter might be connected in common to an internal signal. The illustrated inverter is formed on the P-type substrate 10 and partially within N-well 24. Like N-well 22 illustrated in FIG. 6A, it is possible for the N-well 24 to be formed at a very early stage in the processing, before the implantation of nitrogen to section B of the substrate. The inverter consists of an NMOS FET including gate electrode 70 and source/drain regions 72 and 74. The PMOS FET portion of the inverter is formed on N-well 24 and includes gate electrode 76 and source and drain regions 78, 80. Typically, the inverter includes silicided gate electrodes 70, 76 formed in part from polysilicon layer 48 (FIG. 5B) and includes silicided source/drain regions 72, 74, 78 and 80. The primary differences between the logic circuitry of FIG. 6A and the I/O circuitry of FIG. 6B (on a gate level) is that the FIG. 6B I/O circuit incorporates a thicker gate oxide layer 44 of, for example, approximately 75 Å for both the NMOS and PMOS devices. Other differences may also exist, including gate dimensions and relative doping levels as is appropriate to the different functions and different operating voltages of the two circuits. Of course, none of the interconnect circuitry and wiring is illustrated in either the FIG. 6A logic circuit or the FIG. 6B I/O circuit.

FIG. 6C illustrates portions of two memory cells within an embedded DRAM circuit. As discussed briefly before, it is typical to form both the FIG. 6A logic circuitry and the FIG. 6B I/O circuitry in a process independent of that used for the FIG. 6B embedded DRAM circuit. For example, both the FIG. 6A logic circuit and the FIG. 6B I/O circuit might be formed prior to formation of the FIG. 6C embedded DRAM circuit. The FIG. 6C embedded DRAM circuit is formed starting with the blanket polysilicon layer 48 illustrated in FIG. 5C covering the section C thicker gate oxide layer 46. Preferably, the polysilicon layer is doped N-type by implantation and annealing, and then the polysilicon layer 48 is patterned into gate electrodes 90, 92 of the two transfer FETs for the two illustrated embedded DRAM cells. The two transfer FETs formed on the approximately 100 Å gate oxide layer 46 have source/drain regions 94, 96 and 98 formed by ion implantation of N-type dopants self-aligned to the gate electrodes 90, 92 and the shallow trench isolation regions 20. For the illustrated configuration, the two transfer FETs have a common source region 96 and are coupled to the bottom electrodes of charge storage capacitors through their respective drain regions 94 and 98. A bit line contact and interconnect line 100 is formed in contact with the common source region 96. A relatively thick interlayer dielectric 103 is provided over the transfer FET and the device isolation regions to facilitate use of a planarized capacitor over bit line (COB) structure.

Charge storage capacitors are provided in contact with the drain regions 94, 98 of each of the transfer FETs. The charge storage capacitors may consist of planarized polysilicon lower electrode 102, 104 in contact with the corresponding drain regions 94, 98. A capacitor dielectric layer 106 is formed over the two lower capacitor electrodes 102, 104. Conventionally, this capacitor dielectric layer 106 might be the three layer oxide/nitride/oxide dielectric known as "ONO," but in particularly preferred embodiments of the present invention, an ONO dielectric layer is not used. This is because formation of ONO requires at least one high temperature oxidation process. More preferably, the capacitor dielectric layer 106 is one of the high dielectric constant materials that can be formed in a low temperature CVD or metal-organic CVD (MOCVD) process, such as tantalum pentoxide. These high dielectric constant materials are preferred both because they facilitate high capacitance charge storage capacitors with comparatively simple capacitor structures and because they are formed at lower temperatures than are required for ONO. Accordingly, such high dielectric constant materials are more compatible with the preservation of gate oxide quality that is an emphasis of the present invention. An upper capacitor electrode 108 comprising doped polysilicon is then provided over the capacitor dielectric layer 106 as illustrated in FIG. 6C. Various connections are made within the DRAM circuitry and to the other circuitry of the processing chip.

While the present invention has been described in terms of certain preferred embodiments, those of ordinary skill in the art will appreciate that various modifications and alterations of the methods and structures described herein can be made while not varying from the teachings of the present invention. For example, the methods of the present invention could be applied to other circuitry including mixed mode circuits which incorporate both digital and analog circuitry on a single chip, as well as other combinations of digital circuitry on a single chip. Accordingly, the present invention is not to be limited to any particular embodiment described herein but the scope of the present invention is instead to be determined from the claims which follow.

What is claimed:

1. A method of forming an integrated circuit device comprising:

providing a semiconductor substrate having a surface, the semiconductor substrate having a first region on which a plurality of first MOS devices are to be formed and having a second region on which a plurality of second MOS devices are to be formed;

masking the second region and providing a first concentration of a first dopant in the semiconductor substrate at the surface of the first region without doping the second region;

removing the mask over the second region;

masking the first region and providing a second concentration of a second dopant in the semiconductor substrate at the surface of the second region without doping the first region, wherein the second concentration is different than the first concentration;

oxidizing the surface of the semiconductor substrate to grow a first thickness of oxide on the first region of the semiconductor substrate and to grow a second, different thickness of oxide on the second region in a single oxidizing process; and forming first MOS devices on the first regions of the semiconductor substrate incorporating the first thickness of oxide and forming second MOS devices on the second region incorporating the second thickness of oxide.

2. The method of claim 1, wherein the first concentration of the first dopant causes oxide to grow at a slower rate on the first region than oxide grows on the second region incorporating the second concentration of the second dopant.

3. The method of claim 1, wherein the steps of forming first and second MOS devices include depositing a layer of polysilicon over the first region and the second region so that the layer of polysilicon is separated from the surface of the first region by the first thickness of oxide and the layer of polysilicon is separated from the surface of the second region by the second thickness of oxide.

4. The method of claim 2, wherein the first and second dopants are both nitrogen and the first concentration is greater than the second concentration.

5. The method of claim 3, wherein the first MOS devices are configured as logic circuits and have an operating voltage of less than 3.3 V.

6. The method of claim 3, wherein the first MOS devices have operating voltages lower than the second MOS devices, and wherein the second MOS devices include I/O circuitry.

7. The method of claim 3, wherein the I/O circuitry includes an inverter.

8. A method for forming an integrated circuit device comprising:

provrding a substrate having a first region on which first MOS devices having a first gate oxide thickness will be formed and a second region on which second MOS devices will be formed;

adjusting the composition of the substrate within at least one of the first region and the second region so that the first region and the second region will have different oxide growth characteristics in an oxidation environment, said adjusting including:

masking the second region and providing a first concentration of a first dopant in the substrate at the surface of the first region without doping the second region;

removing the mask over the second region; and masking the first region and proving a second concentration of a second dopant in the substrate at the surface of the second region without doping the first region, wherein the second concentration is different than the first concentration;

subjecting the substrate to an oxidation environment so that a first thickness of a first oxide layer grows in the first region and a second thickness of a second oxide layer grows in the second region upon exposure of the first region and the second region to an oxidation environment; and forming first MOS devices on the first region of the substrate and forming second MOS devices on the second region of the substrate.

9. The method of claim 8, further comprising the steps of:

providing on the substrate a third region on which MOS-based memory devices are to be formed incorporating third MOS devices having a third oxide thickness;

adjusting the composition of the substrate within the third region so that the third region has an oxide growth characteristic different from the oxide growth characteristics of both the first region and the second region;

subjecting the substrate to an oxidation environment so that a third thickness of a third oxide layer grows in the third region upon exposure of the third region to the oxidation environment; and forming third MOS devices on the third oxide layer, the third MOS devices including a gate electrode on the third oxide layer, first and second source/drain regions on either side of the gate electrode, and a charge storage surface connected to the first source/drain region.

* * * * *